(12) United States Patent
Fournel et al.

(10) Patent No.: US 11,694,991 B2
(45) Date of Patent: Jul. 4, 2023

(54) METHOD FOR TRANSFERRING CHIPS

(71) Applicant: COMMISSARIAT A L'ENERGIE ATOMIQUE ET AUX ENERGIES ALTERNATIVES, Paris (FR)

(72) Inventors: Frank Fournel, Grenoble (FR); Emilie Bourjot, Grenoble (FR); Séverine Cheramy, Grenoble (FR); Sylvain Maitrejean, Grenoble (FR); Loic Sanchez, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 65 days.

(21) Appl. No.: 17/304,664

(22) Filed: Jun. 24, 2021

(65) Prior Publication Data

US 2021/0407961 A1 Dec. 30, 2021

(30) Foreign Application Priority Data

Jun. 25, 2020 (FR) ...................................... 20 06667

(51) Int. Cl.
*H01L 21/683* (2006.01)
*H01L 23/00* (2006.01)
(Continued)

(52) U.S. Cl.
CPC .............. *H01L 24/97* (2013.01); *B32B 38/00* (2013.01); *B32B 38/18* (2013.01);
(Continued)

(58) Field of Classification Search
CPC ........... H01L 24/97; H01L 2224/95085; H01L 21/67144; H01L 24/75; H01L 2221/68318; H01L 21/6835; H01L 24/83; H01L 24/95; H01L 2221/68354; H01L 2221/68363; H01L 2221/68368; H01L 2221/68381; H01L 2224/32225; H01L 2224/75151; H01L 2224/7565; H01L 2224/75755;
(Continued)

(56) References Cited

U.S. PATENT DOCUMENTS

| | | | | |
|---|---|---|---|---|
| 8,349,660 B2* | 1/2013 | Delapierre | .............. | G01P 1/023 438/106 |
| 11,114,411 B2* | 9/2021 | Schwarz | ................. | H01L 24/29 |

(Continued)

OTHER PUBLICATIONS

French Preliminary Search Report dated Mar. 17, 2021 in French Application 20 06667 filed on Jun. 25, 2020, 18 pages (with English Translation of Categories of Cited Documents & Written Opinion).

(Continued)

*Primary Examiner* — Vu A Vu
(74) *Attorney, Agent, or Firm* — Oblon, McClelland, Maier & Neustadt, L.L.P.

(57) ABSTRACT

A method for transferring at least one chip, from a first support to a second support, includes forming, while the chip is assembled to the first support, an interlayer in the liquid state between, and in contact with, a front face of the chip and an assembly surface of a face of the second support and a solidification of the interlayer. Then, the chip is detached from the first support while maintaining the interlayer in the solid state.

16 Claims, 8 Drawing Sheets

(51) Int. Cl.
  *B32B 38/00* (2006.01)
  *B32B 38/18* (2006.01)
  *H01L 21/67* (2006.01)

(52) U.S. Cl.
  CPC .... *H01L 21/67144* (2013.01); *H01L 21/6836* (2013.01); *H01L 2224/95085* (2013.01); *H01L 2224/97* (2013.01)

(58) Field of Classification Search
  CPC ... H01L 2224/7598; H01L 2224/83005; H01L 2224/83191; H01L 2224/83815; H01L 2224/95001; H01L 2224/95136; H01L 2224/95146; H01L 2924/1515
  USPC .......................................................... 438/107
  See application file for complete search history.

(56) References Cited

U.S. PATENT DOCUMENTS

| | | | |
|---|---|---|---|
| 2004/0154733 A1* | 8/2004 | Morf | H01L 24/83 |
| | | | 156/716 |
| 2010/0123268 A1 | 5/2010 | Menard | |
| 2012/0291950 A1* | 11/2012 | Sugiyama | H01L 21/6835 |
| | | | 156/60 |
| 2019/0252221 A1 | 8/2019 | Chen et al. | |
| 2019/0252350 A1* | 8/2019 | Schwarz | H01L 24/75 |

OTHER PUBLICATIONS

Fukushima et al., "New Chip-to Wafer 3D Integration Technology Using Hybrid Self-Assembly and Electrostatic Temporary Bonding", IEEE, 2012, 5 pages.
Fukushima et al., "Transfer and Non-Transfer Stacking Technologies Based on Chip-to-Wafer Self-Assembly for High-Throughput and High-Precision Alignment and Microbump Bonding", IEEE, International 3D Systems Integration Conference, 2015, 4 pages.
Jouve et al., "Self-Assembly process for 3D Die-to-Wafer using direct bonding: A step forward toward process automatisation", 2019 IEEE 69th Electronic Componentsand Technology Conference(ECTC), 2019, 10 pages.
Menezo et al., "Advances on III-V on Silicon DBR and DFB Lasers for WDM optical interconnects and Associated Heterogeneous Integration 200mm-wafer-scale Technology", IEEE, 2014, 6 pages.
"Microdrop Dispenser Heads", Microdrop Technologies Gmbh, 2016, 2 pages.
Sanchez et al., "Chip to wafer direct bonding technologies for high density 3D integration", 2012, 5 pages.
Sanchez et al., "Collective Die Direct Bonding for Photonic on Silicon", ECS Transactions, 86(5), 2018, pp. 223-231.
"Enabling silicon photonics through advances in III-V integration on silicon", semiconductor Today, vol. 9, issue 6, 2014, 4 pages.
Bower et al., "Heterogeneous Integration of Microscale Semiconductor Devices by Micro-Transfer-Printing", XCeleprint, 2015,35 pages.

* cited by examiner

SECTION A-A

METHOD FOR TRANSFERRING CHIPS

TECHNICAL FIELD

The present invention relates to the field of chips used in microelectronics. Microelectronic device means any type of device produced with the means of microelectronics. These devices encompass micromechanical or electromechanical devices (MEMS, NEMS, . . . ).

It finds application in all sectors wherein chips are used. For example, these chips can be intended for integration on supports themselves implanted in microelectronic devices, such as imagers, or other devices implementing integrated circuits, such as those related to 3D integration with stacks of CMOS transistors and/or memories.

PRIOR ART

The implementation of chips in microelectronic devices leads to handling the chips on the one hand with a part of the process related to their proper manufacture, generally on a first support, and on the other hand with a part of the process related to the transfer of the chips in the devices, that is to say that the chips are transferred to another medium.

Historically, chips were often transferred one after another, by individual handling tools.

Collective transfer technologies of such chips have more recently been proposed, for example in the scientific publication "A. Jouve, in 2019 IEEE 69th Electronic Components and Technology Conference (ECTC) (2019), pp. 225-234". According to this document, on the basis of a starting substrate, the chips are first singled out, then transferred one by one to a temporary support to undergo a preparation therein (for example a cleaning following the mechanical step of singularisation). Then, the chips are transferred to a destination substrate. For this transfer, this technology has the advantage of allowing direct gluing of the chips, possibly by implementing a technology of self-aligning the chip relative to the area of the destination substrate which is assigned thereto, thanks to the formation of water droplets between each chip and the transfer substrate, allowing to accommodate position shifts.

The technology allowing chip transfers according to this scientific publication can however be improved, especially in a context of increased production rates, the proposed technique not allowing complete collective transfer of chips. However, the individual handling of chips suffers from technological limitations related, for example, to their insufficient resolution relative to the increasingly reduced dimensions of the chips.

In other cases, even if the size of the chips still allows their individual gripping, by the head of a component placement tool (often called a "pick and place" system), significant dimensional limitations are encountered when it comes to disposing these chips individually on the same support.

For example, when it comes to holding the chips on a support, such as those of the handle type, for example for some technological steps such as cleaning or surface activations, the current supports necessarily carry the chips apart from each other, because the cavities which receive them are separated by walls which must be sufficiently thick for reasons of mechanical strength. In practice, a space of the order of 500 µm is generally induced between each chip on such supports.

An object of the present invention is to provide a solution to all or part of the disadvantages of current techniques. In particular, it offers a solution to the transfer of one or more chips from a first support to a second support, in an improved manner.

The other objects, features and advantages of the present invention will become apparent upon examining the following description and the accompanying drawings. It is understood that other advantages can be incorporated.

SUMMARY

According to one embodiment, provision is made of a method for transferring at least one chip, from a first support to a second support, comprising:
 while the chip is integral with the first support, a formation of an interlayer in the liquid state between, and in contact with, a front face of the chip and an assembly surface of a face of the second support, and a solidification of the interlayer;
 then, a detachment of the chip from the first support while maintaining the interlayer in the solid state.

The technique of depositing a droplet of water, usually used in the context of adjusting the relative position of two parts to be assembled by direct gluing, is thus diverted. Here, the liquid, which can still be water, has the function of making a more solid attachment between the second support and the chip.

According to one aspect, the detachment can comprise a relative movement of the first support and the second support.

According to a non-limiting aspect, the detachment comprises a relative displacement of the first support and of the second support configured to break a mechanical bond between the first support and the chip. The attachment provided by the interlayer is then chosen sufficient to overcome the bonding force, such as an anchoring, between the first support and the chip.

According to another non-limiting aspect, the detachment comprises the deactivation of a system for retaining the chip on the first support, for example the cutting of a vacuum system or the opening of a clamp.

Since the interlayer is produced in the liquid state, its formation is easy, for example in the form of a droplet. It can be precisely located if needed. Approximating the second support previously placed at a low temperature (low enough to solidify the interlayer) can allow to solidify the interlayer almost instantaneously when its face docks the previously liquid layer. The second support can alternatively be cooled after its contact with the liquid interlayer.

According to one aspect, the interlayer is removed after the transfer. Again, the use of a first liquid interlayer allows this removal, for example by simple evaporation. In particular, it is then possible to achieve direct gluing of the front face of the chip to the assembly surface of the second support.

According to one aspect, but in a non-limiting manner, this transfer is carried out collectively, that is to say for several chips at the same time. This avoids the systematic use of individual chip handling tools.

According to another aspect, the transfer is carried out individually, for one or more chips. The latter can then for example be maintained on the second support closely to each other.

BRIEF DESCRIPTION OF THE FIGURES

The purposes, objects, as well as the features and advantages of the invention will become more apparent from the detailed description of an embodiment thereof which is illustrated by the following accompanying drawings wherein.

Figure 1:
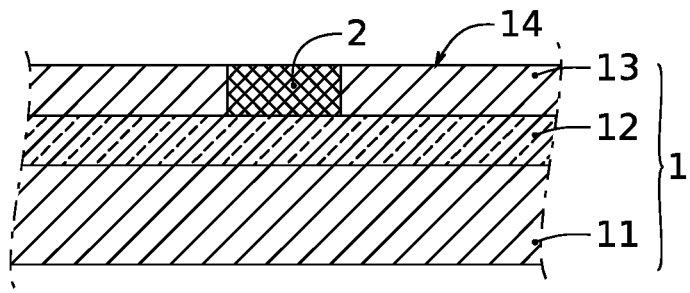
FIG. 1 shows an example of a first support at which a chip has been manufactured.

The drawings are given by way of example and are not limiting of the invention. They constitute schematic principle representations intended to facilitate the understanding of the invention and are not necessarily on the scale of practical applications.

DETAILED DESCRIPTION

Before starting a detailed review of embodiments of the invention, optional features are set out below which may optionally be used in combination or alternatively:

The solidification comprises placing the assembly surface 411 of the face 41 of the second support 4 at a temperature below a solidification temperature of the interlayer 3. The thermal conduction then serves to cool the layer 3 and to solidify same.

The formation of the interlayer 3 comprises forming a liquid coating on the front face 22 of the chip 2, then approximating the first support 1 and the second support 4 so as to contact the liquid coating and the assembly surface 411 of the face 41 of the second support (4). The layer 3 is thus possibly formed with conventional techniques on a surface, which may be flat.

The placement of the assembly surface 411 of the face 41 of the second support 4 at a temperature below a solidification temperature of the interlayer 3 is carried out before contacting the liquid coating with the assembly surface 411 of the face 41 of the second support 4. This can for example speed up the method. It is also possible to cool after contacting, for example in the case where several chips are on the first support 1, the contacting being better if the layer 3 does not rapidly pass to the solid state.

The formation of the interlayer 3 comprises a phase of condensing, on the front face 22 of the chip 2, a compound of an atmosphere wherein the first support 1 and the second support 4 are placed.

The method comprises, preferably after detachment, a removal of the interlayer 3, and a direct gluing of the front face 22 of the chip 2 on the assembly surface 411 of the face 41 of the second support 4;

This allows a direct transfer in a simple way; the material of the interlayer then advantageously passes through the three states: liquid, solid and gas.

The removal of the interlayer 3 comprises an evaporation of the interlayer 3; this can be done by heating the second support 4 beyond an evaporation temperature of the interlayer 3. It is also possible to heat to return to the liquid state and then allow the liquid to evaporate without additional heating; for this purpose, the whole is placed in an atmosphere unsaturated with water vapour; to speed up the process, the humidity in the atmosphere can be decreased; for this purpose, a desiccator can be used, a dry gas can be introduced or the temperature of the atmosphere can be increased which reduces the humidity. It is also possible to increase the temperature of the liquid, but without reaching a boil which could destabilise the chip.

It is thus possible to control the behaviour of the interlayer thanks to the temperature of the second support, at least during part of the modification phases of this layer.

The assembly surface 411 of the face 41 of the second support 4 is formed with the same dimensions as the front face 22 of the chip 2.

The front face 22 of the chip 2 and the assembly surface 411 of the face 41 of the second support 4 are hydrophilic, and the assembly surface of the face 41 of the second support 4 is surrounded by a hydrophobic surface.

This allows a phenomenon of self-alignment. This can also be the case with the assembly surface 511 of a third substrate.

The assembly surface 411 of the face 41 of the second support 4 is disposed projecting on the face of the second support 4.

It is thus physically individualised, which may be favourable to the precision of locating the liquid of the interlayer, such as a droplet. This can also be the case with the assembly surface 511 of a third substrate.

The front face 22 of the chip 2 and the assembly surface 411 of the face 41 of the second support 4 are hydrophobic. This option allows, for example, to promote adhesion to another hydrophilic support, subsequently, the hydrophobic bond being weaker than that of a hydrophilic surface.

The method may further comprise, after the detachment, securing a rear face 21, opposite the front face 22, of the chip 2 on a face 51 of a third support 5, then separating the front face 22 of the chip 2 and the assembly surface 411 of the face 41 of the second support 4. The interlayer 3 can be returned to the liquid state before the separation of the front face 22 of the chip 2.

The method optionally comprises, after detachment:
  forming a second interlayer 6 in the liquid state between, and in contact with, a rear face 21 of the chip 2, opposite the front face 22, and an assembly surface of a face 51 of a third support 5, the rear face 21 of the chip 2 and the assembly surface of the face 51 of the third support 5 being hydrophilic, then,
  while the interlayer 3 and the second interlayer 6 are in the liquid state, separating the front face 22 of the chip 2 and the assembly surface 411 of the face 41 of the second support 4 by relative displacement of the second support 4 and the third support 5.

According to one possibility, the method comprises, after the separation, a removal of the second interlayer 6, and a direct gluing of the rear face 21 of the chip 2 on the assembly surface of the face 51 of the third support 5.

The assembly surface 511 of the face 51 of the third support 5 is formed with the same dimensions as the rear face 21 of the chip 2.

The assembly surface 511 of the face 51 of the third support 5 is disposed projecting on the face of the third support 5.

The interlayer 3 and/or the second interlayer 6 can be formed by a film; this allows, for example, to share this layer for several chips. For example, the transfer onto the third support 5 can be collective and the film is then produced on the surface of this support, avoiding a succession of depositions of droplets.

Optionally, the method comprises, before the formation of an interlayer 3:
while the chip 2 is contained throughout the thickness of a surface layer 13 of the first support 1, a removal of a portion of the surface layer 13 configured to cut out the chip 2 while preserving at least one anchoring area 16 between the chip 2 and the surface layer 13,
then, a removal of a portion of a layer 12 underlying the surface layer 13, configured to release a rear face 21 of the chip 2, opposite the front face 22,
so as to suspend the chip 2 by at least one anchoring area 16. Thanks to this arrangement, the chip is only slightly retained on the first support.

In general, in this embodiment, the method preferably comprises a phase of reducing the anchoring of the chip relative to the first support, this phase allowing to reduce a breaking limit value of the bond between the chip and this support.

In one embodiment, the first support 1 is a chip pick and place head, and the detachment comprises a deactivation of a system for holding the chip on the pick and place head.

The formation of the interlayer 3 can successively comprise:
a pickup of the chip 2, by a rear face 21 opposite the front face 22, by the pick and place head 210 from an initial support 7 of the chip, the pickup comprising an activation of the system for holding the chip 2;
a first displacement of the pick and place head to a droplet deposition tool 400;
a formation of a droplet, intended to form the interlayer 3, on the front face 22 of the chip 2 by means of the droplet deposition tool 400;
a second displacement of the pick and place head to the second support 4, configured so that the droplet contacts the face 41 of the support 4.

Optionally, the transfer is repeated using the pick and place head successively, for a plurality of chips, so as to place the plurality of chips 2 on the face 41 of the second support 4.

According to one possibility, a flexible donor substrate is used, typically the first support 1.

The method can be operated simultaneously for a plurality of chips.

It could in particular be applied to transfers of very small chips, which are difficult to handle individually. But another application is the individual transfer of chips closely on the face of a carrier.

It is specified that, in the context of the present invention, the term "on" or "above" does not necessarily mean "in contact with". Thus, for example, the deposition of a layer on another layer does not necessarily mean that the two layers are directly in contact with each other but it means that one of the layers at least partially covers the other by being, either directly in contact therewith, or by being separated therefrom by a film, or else another layer or another element. A layer can also be made up of several sub-layers of the same material or of different materials.

It is specified that in the context of the present invention, the thickness of a layer or of the substrate is measured in a direction perpendicular to the surface along which this layer or this substrate has its maximum extension. If a layer is not completely flat, in particular because it has defects which are likely to be in relief on the exposed face of said layer, the thickness means the dimension of this layer outside of its flaws.

It is specified that in the context of the present invention, the term "chip" is understood to mean any microelectronic element intended to be transferred on a device, in particular on a support of larger dimension than the chip. These chips can be processed or not, or else made from silicon or from other materials such as InP, for example, or also be made of AsGa, SiC, Silica, Germanium, Sapphire and have layers on the surface layers of materials such as silica, silicon nitride, metals such as copper or titanium, and all other layers known to microelectronics ($HfO2$, SiOC, AlN, $Al2O3$, GaN, . . . ).

Typically, the chips can contain integrated circuits, which can be connected to the outside by means of electrical interconnection parts. These interconnections can be made directly at the gluing interface. These electrical connection parts may have dimensions of less than 5 μm, which implies very high chip placement precision, of the order of a micrometre for example.

The chips can be the subject of a treatment prior to the implementation of the transfer proposed here, but also of a subsequent treatment. Such treatments can correspond to the integration of circuits, vias or any active or passive component. For example, the transfer described according to the invention can be carried out on the basis of not yet fully formed chips, possibly still simply consisting of a simple block of homogeneous material intended to be subsequently transformed.

The chips may have a parallelepipedal shape, preferably rectangle, and, at the very least, have a rectangular, or else square cross-section, allowing to delimit a front face and a rear face having such a cross-sectional shape. By way of example, the invention can be implemented with chips of very small dimension, for example less than 250 μm in their longest dimension.

One aspect of the invention takes advantage of the solidification of an interlayer between a face of a chip and its support, so as to extract the chip from the latter.

FIGS. 1 to 8 correspond to a series of potential steps.

A first embodiment of the invention. This example is particularly adapted for handling chips, collectively, and/or without having to resort to tools for picking up and placing chips.

First, FIGS. 1 to 4 give an example of the preparation of a first support 1 which can constitute the starting substrate for a chip, and preferably for a plurality of chips. Indeed, one advantage of the invention is to be able to collectively implement all or part of the chip transfer steps. Thus, the description given below with regard to a chip can be generalised for a simultaneous transfer of several chips from the first support.

In FIG. 1, this support 1 is represented in a non-limiting manner in the form of a substrate of the semiconductor type (typically silicon) on insulator, known by the acronym SOI. For example, a base layer 11 forms the major part of the thickness of the support 1, and is surmounted by a buried layer 12, for example of a dielectric nature, which is generally formed of silicon oxide. Layer 12 may represent a thickness of 400 nm as an illustration. It is surmounted by a surface layer 13, which is generally very thin (for example 100 nm), for example made of monocrystalline silicon, which is used to build subsequent parts of microelectronic devices, such as chips. In this example, a chip 2 was built into layer 13, or is simply a portion of that layer that one wishes to extract. It extends therein along the entire thickness of the layer 13, so that the upper face of the chip 2, hereinafter referred to as the front face 22, is exposed to the face 14 of the surface layer 13. Preferably, the rear face 21, opposite the face 22, is located at the interface with the underlying layer 12.

Such a structure is exploited here in order to limit the anchoring of the chip 2 relative to the first support 1, so as to allow, then, a detachment.

Figure 2A:
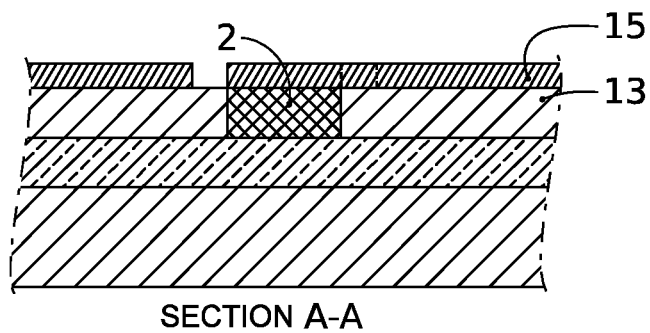
FIG. 2A shows a masking step before etching leading to reduce the anchoring of the chip relative to the first support.

In this context, FIG. 2A shows a step of masking by a layer 15, made for example of a photolithography resin, delimiting a surface of the face 14 which remains exposed. As shown more specifically in FIG. 2B, the masking is organised so that only a small connection portion remains between the chip 2 and the surface layer 13 wherein it is housed. In particular, anchoring delimitation areas 141 ultimately allow only small connection portions of the chip 2 to remain.

Figure 2B:
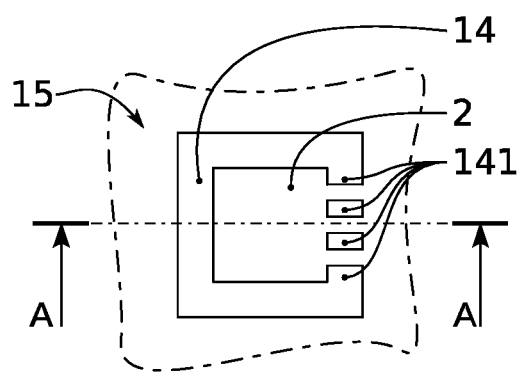
FIG. 2B shows a top view of the step of the previous figure, the latter corresponding to a section along lines A-A of FIG. 2B.
Figure 3:
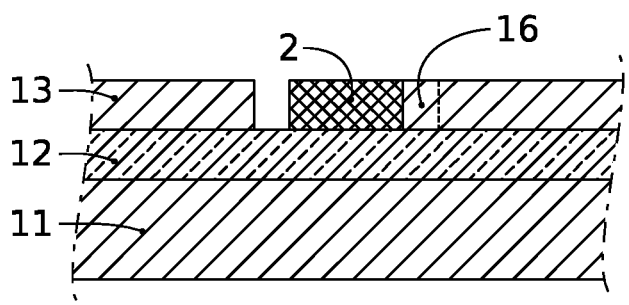
FIG. 3 shows a step subsequent to that of the two preceding figures.
Figure 4:
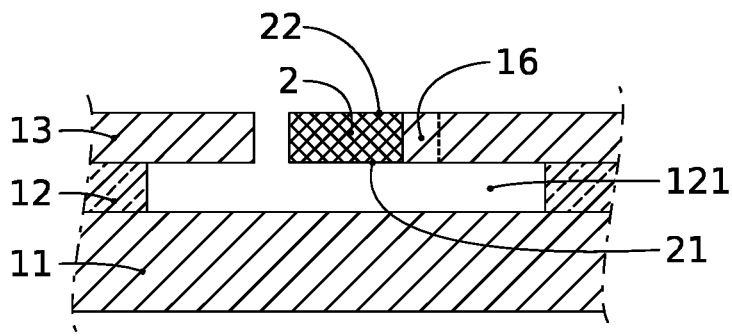
FIG. 4 reflects a first support on which a chip is suspended.

As shown in FIG. 2B, the unmasked area of layer 13 forms a contour, which may be globally homothetic, around the section of chip 2. However, this contour is not closed, in the sense that the areas 141 are discontinuous. If necessary, a single break in the continuity of the contour defined by the mask is sufficient. The trench thus formed may, for example, be 50 µm wide around the chip. The latter is, in the example shown, of square section, and for example 0.5×0.5 mm².

Thus, when an etching (in particular an ionic etching) is carried out in the surface layer 13, through the unmasked areas of the face 14, it is possible to very predominantly cut out the chip 2, which is connected to the surface layer only by an anchoring area 16 formed by the bridge(s) previously defined in the mask. This is the result shown in FIG. 3. In the dimensional example given above, anchor bridges, in particular four anchor bridges, can remain with an individual width of 50 µm. It will be seen later that the breaking strength of the anchoring area 16 is adapted so that it can be overcome by a detachment force which will be applied by a second support 4.

The chip 2 is then suspended by an excavation of the underlying layer 12. In the case where the latter is made of silicon oxide, an etching can be carried out, in particular by hydrofluoric acid, in the liquid phase or in the vapour phase. The etching time control ensures the shape of the desired cavity 121 in the layer 12. It appears that the chip 2 is connected to the first support 20 only by the anchoring area 16, of reduced section.

The embodiment illustrated for the first support 1 is not limiting. In particular, here support means any element capable of receiving, at least temporarily, the chip(s). It could be a plate, a simple or more complex substrate, as in the case of the SOI substrate described above. And further, with reference to the illustrations of FIGS. 14 to 21, it could also be a machine member, and for example an individual or collective chip displacement head; for example, it may be the head of a pick and place tool. It is also possible that the first support 1 is a flexible substrate (tape) formed of a carrier film surmounted with an adhesive film. The carrier film may for example be based on a polymer (PET or PVC for example) and the adhesive film based, for example, on acrylate or silicone. The chip 2 is then integral with the adhesive film. A plurality of chips 2 can be disposed on the adhesive film, for example in a regular arrangement in line or in the shape of a matrix. The flexible film can optionally be secured to a rigid support on the side of the carrier film.

Figure 5:
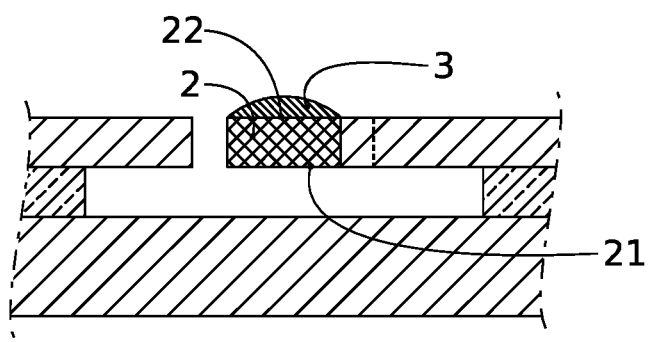
FIG. 5 shows the formation of a liquid coating, such as a droplet.

FIG. 5 shows a step of forming a droplet intended to form an interlayer 3, in the liquid state at this stage. Preferably, the liquid used is water, or predominantly, by mass, based on water. However, it is not excluded that other liquids are used, for example to adjust the solidification point or the dew point or the desired viscosity at working temperatures.

According to a non-limiting embodiment, the front face 22 of the chip 2 can be treated beforehand to make it hydrophilic, this treatment advantageously sparing the rest of the face of the first support 1.

For example, this could be a treatment with UV/ozone for two minutes. Alternatively or in addition, some surfaces can be made hydrophobic, so as to obtain the desired capillary force differential; this treatment is for example implemented with hydrofluoric acid if the corresponding face of the chip or of the support is made of silicon.

Hydrophilic character refers to an affinity with water; by extension, this term is also used here to designate, more generically, an affinity of a surface with the liquid used for layer 3 (and further on for layer 6) even if it is not a question of water. Hydrophobic character is understood to mean a lower affinity with water and, by extension, a lower affinity with the liquid used. Here a surface more hydrophilic than a surface defined as hydrophobic here means a hydrophilic surface. A hydrophilic surface will tend to spread liquid more than a hydrophobic surface; for a droplet, the angle defined by the surface and the tangent of the droplet at its base will be greater for a hydrophobic liquid. It can be acute for a hydrophilic surface and obtuse for a hydrophobic surface.

Thanks to this treatment, the deposition of the droplet (of water) can be precisely delimited on the surface of the front face 22 of the chip 2. The front face 22 is also advantageously more hydrophilic than the rear face 21 of the chip 2.

It may be useful to place the first support 1 at a low temperature, to preserve liquid water during operations. For example, the first support can be cooled with a setpoint of 3° C. Cumulatively or alternatively, the humidity of the atmosphere surrounding the first support can be controlled so that the liquid, in this case the droplet in the case of the figures, does not evaporate or does not evaporate too much. For example, the atmosphere for carrying out the formation of the liquid layer can comprise a saturated vapour pressure for the temperature of the first support 1, or just below this temperature, at less than 50% (for example for a temperature of 3° C., a partial vapour pressure of approximately 6.6 mbar is sufficient; if the pressure is 50% below this pressure (that is to say around 4 mbar) the dew temperature is then −4 ° C.

The liquid layer 3 can be produced by depositing a droplet of water; for example, a droplet of 100 µm in diameter on the surface of the chip can be deposited by an existing drop deposition tool. The result produced corresponds to that of FIG. 5. The selective hydrophilic character of the front face 22 of the chip 2 precisely delimits the area of formation of the liquid layer.

The transfer as such on a second support 4 can then be started.

Figure 6:
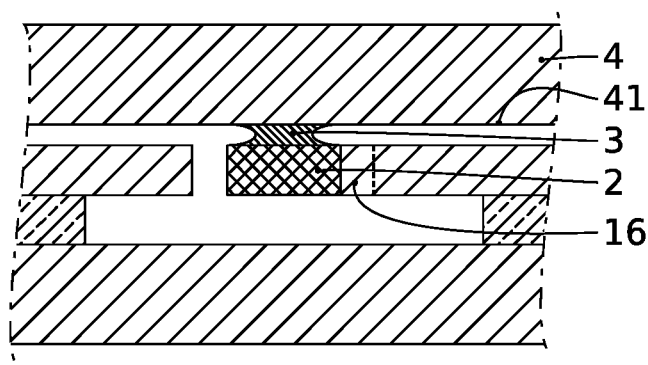
FIG. 6 shows the formation of an interlayer between the chip and a second support.

FIG. 6 shows an approximation of this second support 4 in the direction of the liquid material up to its docking, so as to produce the interlayer 3 forming an interface between a surface for assembling the chip on the face 41 of the second support 4 and the front face 22 of the chip 2.

In one embodiment, the second support 4 is a handle onto which the chip(s) are transferred in an intermediate manner, before another transfer to a third support. In this context, it may be a one-piece substrate, for example made of silicon. According to another embodiment, the second support 4 is the destination substrate for the chip 2.

The approach of the second support 4 can be carried out on a conventional mandrel machine by which this support 4 is held.

Preferably, it is by the temperature of the second support 4 that it is possible to solidify the material of the interlayer 3. To this end, the second support 4 can be placed at a suitable temperature, namely below the solidification temperature of the liquid of the layer 3, before its approximation then at its docking shown in FIG. 6. For example, in the case of water, the support 4 can be placed at a temperature of −3° C. Cooling techniques of the type using the Peltier effect could be used in general to control the temperature of the relevant device parts, and in particular the second support 4.

Preferably, the atmosphere which surrounds the supports 1 and 4 and at a dew temperature lower than the temperature of the surface of the second support 4. To this end, the humidity is reduced just before the docking of the second support 4 on the layer 3 if necessary.

It is understood that when the second support 4 touches the layer 3, the latter solidifies (that is to say freezes in the case of water).

This process ensures a relatively high adhesion of the chip 2 on the second support 4. The level of adhesion is selected, in correspondence with the breaking limit of the bond 16, so that the chip 2 remains integral with the second support 4 when the latter is remote from the first support 1. Optionally, it is the first support (or both supports) which is removed. Advantageously, the relative movement of the supports 1 and 4 induces a bending stress on the bond 16 (which can be in the form of one or more beams, or bridges).

Figure 7:
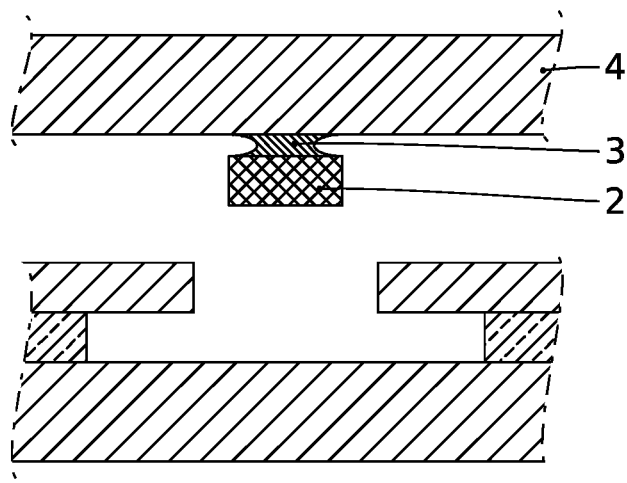
FIG. 7 reflects the detachment of the chip from the first support.

This detachment of the support 20 is schematically shown in FIG. 7, the broken bond 16 no longer being represented therein for simplicity. Any other form of securing is within the scope of the invention, by breaking a mechanical part as in the case of FIG. 7 or by any other means.

Figure 8:
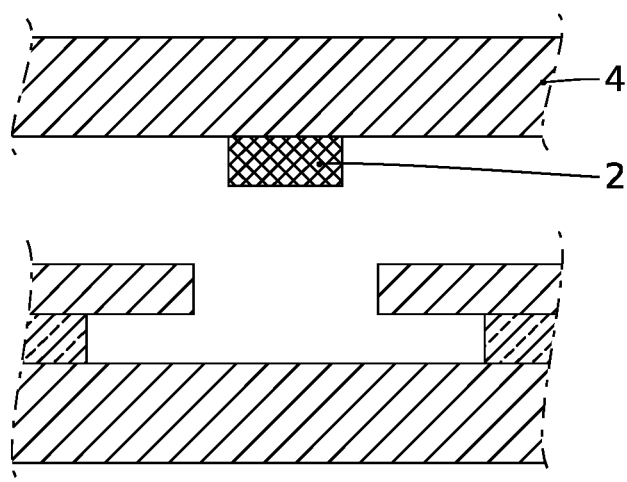
FIG. 8 shows a potential final result of gluing the chip onto the second support.

According to a possibility shown in FIG. 8, a next step is to remove the layer 3. To this end, it is possible to increase the temperature of the second support 4, for example up to 20° C. to melt the droplet of water initially in the form of ice. Preferably, the threshold of 100° C. is not exceeded during this heating.

When the layer 3 is completely removed, the result is a direct gluing of the front face 22 of the chip 2 on the second support 4.

According to one possibility, before the phase of approximating and docking the second support 4 on the liquid coating forming the layer 3, the temperature of the second support 4 remains above the solidification temperature of the liquid used (typically above 0° C. in the case of water). The temperature of the second support 4 is lowered only afterwards, below this solidification temperature. This arrangement is particularly advantageous in the case of a collective transfer of several chips. Indeed, it is in this case simpler for the docking to occur without immediate solidification of the liquid.

According to another variant, for the formation of the liquid interlayer 3, the operation is carried out by condensation by reducing the temperature of the first support 1 until it is placed below the dew temperature of the atmosphere (typically air) surrounding this first support 1. For example, the humidity of the atmosphere can be fixed so that the dew temperature is 6° C. The first support 1 is then placed at a temperature below the dew temperature, for example 4° C. Droplets form, in particular on the hydrophilic parts to the detriment of the hydrophobic parts. The condensation is then concentrated on the front face 22 of the chip.

Optionally, after docking the second support 4 on the interlayer 3, the humidity of the air can be lowered to have a lower dew temperature, for example −5° C., and the temperature of the second substrate is lowered as planned previously, for example at −3° C. In this variant, as in the previous case, the detachment of the chip relative to the first support 1 takes place when the interlayer 3 is solid, so as to break the bond 16. Also as previously, one can then eliminate the liquid and proceed with a direct bonding, which is preferably self-aligned by acting on the hydrophilic character of the surfaces involved by the direct gluing.

According to one possibility mentioned above, the second support 4 is only transient. This variant corresponds to the embodiment of FIGS. 9 and 10.

Figure 9:
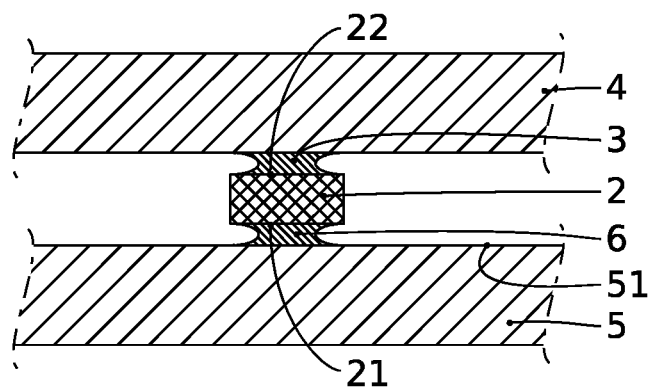
FIG. 9 shows a variant with a second interlayer for a second transfer.
Figure 10:
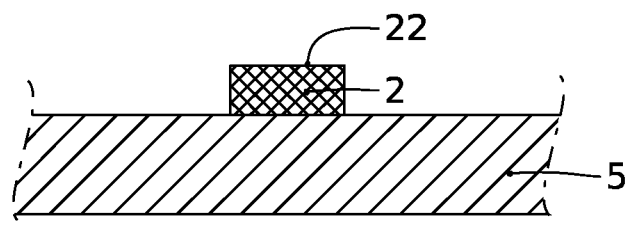
FIG. 10 shows the result of the second transfer.

Thus, in FIG. 9, after the detachment of the chip 2 relative to the first support 1, the chip 2 is held on the second support 4 by the interlayer 3 still in the solid state. This state allows additional handling to transfer the chip 2 again towards the face 51 of a third support 5.

This transfer uses an interlayer 6 in the liquid state. This layer 6 is formed on a face 51 of the substrate 5. The liquid used can be water as above. The descriptions given in the context of the layer 3 can be used for the formation of layer 6, by droplet deposition or by condensation.

It is also possible, for example, to implement a technique for forming a film of water, advantageously deionised water, spread over the face 51 of the third substrate 5. It is possible to use a centrifugation method, for example at 30 rpm for 20 seconds to leave only a film of water on the face 51 with a thickness of the order of 50 to 75 µm. This arrangement has the advantage of ensuring complete coverage of the face 51, useful in the case of a collective transfer of a plurality of chips 2.

It is understood that, when the third support 5 is approximated to the second support 4 by the rear face 21 of the chip 2, a capillary bridge appears between this rear face 21 and the face 51 of the third support 5. This approximation and docking phase can be carried out while the interlayer 3 is still in the solid state, but can also be carried out while the layer 3 has already returned to the liquid state by heating the second support 4.

Care will have been taken to ensure that the capillary force between the face 21 and the face 51 by the interlayer 6 is greater than that between the face 22 and the face 41 by the interlayer 3.

In this way, when the two supports 4, 5 are moved away from each other, the interlayer 3 being in the liquid state, the chip 2 remains integral with the third support 5 to the detriment of the second support 4. After removal of the layer 6, for example by drying the water, the chip 2 is glued, by direct gluing, to the third support 5.

To ensure capillary forces differentiated between that produced by the layer 3 and that produced by the layer 6, it is possible to act on a more hydrophilic character of the surfaces 21 and 51 connected by the layer 6, relative to the surfaces 22 and 41 connected by layer 3. In particular, a surface treatment can be carried out on the surfaces 21 and 51 to make them hydrophilic. A treatment as indicated above can be implemented.

It is also possible to create the second interlayer 6 by changing the humidity (or the dew temperature) of the atmosphere surrounding the chip 2. Indeed, if the humidity is increased so that the dew temperature exceeds the temperature of the support 4 and the chip 2, water droplets will appear on the hydrophilic face (here the rear face 21) of the chip 2. The dry support 5 can then be approximated and contact the water droplets on the rear face 21 of the chip 2. Since the dew temperature of a hydrophilic surface is always slightly lower than the dew temperature of a hydrophobic surface, if the temperature is just above the hydrophilic dew temperature, it is possible to only get droplets of water on the back face 21 of the chip 2. However, even if the temperature is above the dew temperature of the hydrophobic surfaces, as the chip 2 is not in the same plane as the second support 4, it will always be possible to contact and transfer only the chip with the substrate 3.

Figure 11:
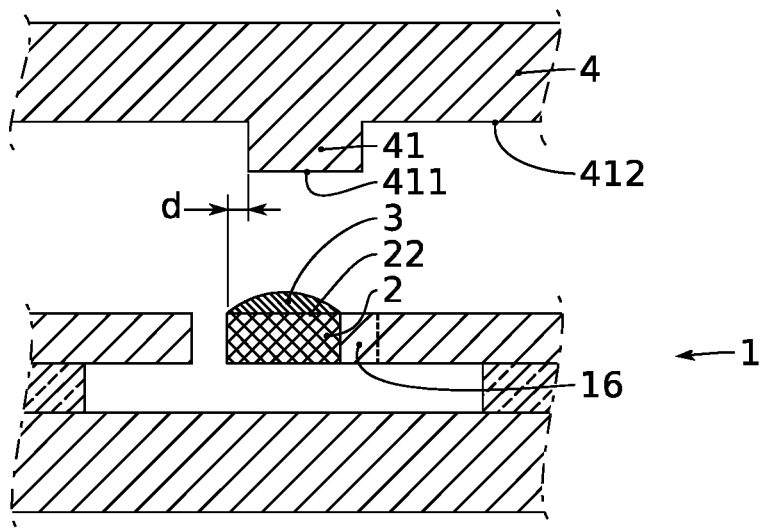
FIGS. 11 to 13 show a variant embodiment with self-alignment of the chips.
Figure 12:
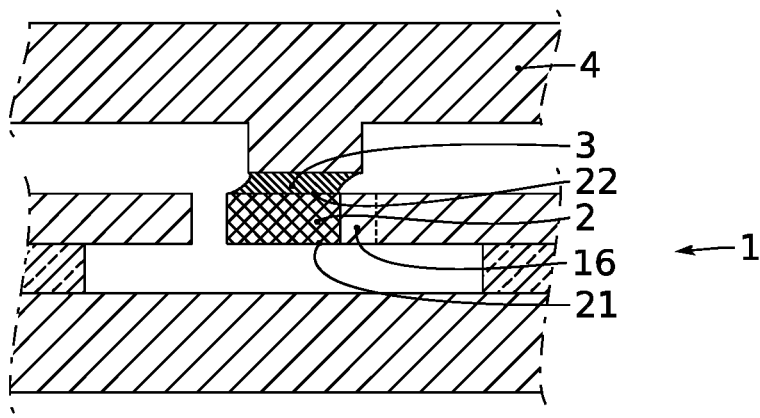
Figure 13:
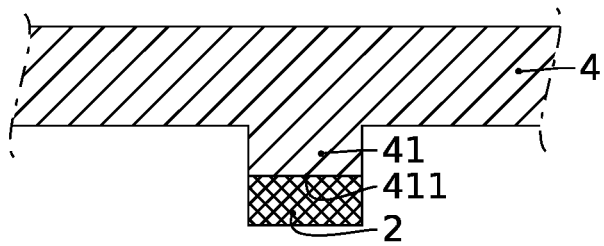

FIGS. 11 to 13 show another variant embodiment, which can be combined with the preceding indications.

Indeed, it is possible to use an offset adjustment between a first support and a second support during the transfer operation. FIG. 11 shows as previously a first support 1 within which a chip 2 is suspended, with a weak bond relative to the support. An interlayer 3, as above in the form of a droplet, covers the front face 22 of the chip 2.

This time, the second support 4 has a face 41 provided with a surface 411 achieving the assembly surface with the chip 2 and the surfaces 411 projecting relative to a peripheral surface 412 of the face 41. It is understood that this arrangement allows to favour contacting the material of the layer 3 with the surface 411, rather than with the surface 412. Preferably, the surface 411 is moreover hydrophilic (reference can once again be made to the treatment mentioned above to make it hydrophilic) while the surface 412 is hydrophobic. The sides around the surface 411 are preferably part of the hydrophobic surface.

Due to this physical and chemical configuration, the droplet will have a natural tendency to adhere to the assembly surface 411. Even if there is a lateral shift, in the plane of the face 14 of the first support 1 between the chip 2 and the assembly surfaces 411. This shift is here represented by dimension d in FIG. 11.

FIG. 12 shows that, despite the shift, the layer 3 forms a capillary bridge between the surface 411 and the front face 22. After elimination of the layer 3, the direct gluing produced is therefore precisely localised on the desired assembly surface 411, as shown in FIG. 13.

It is understood that the projecting arrangement of the assembly surface 411, and advantageously hydrophilic relative to the peripheral surface 412, thus used on the second support 4 can be applied, mutatis mutandis, in the case of the embodiment inducing a second transfer, as shown in FIG. 9. In this case, it is advantageously the third support 5 which is configured to have a face 51 having a hydrophilic and/or projecting assembly surface, relative to the area of the face 51 which surrounds it.

Preferably, the hydrophilic and/or projecting surface intended to cooperate with the chip has the same dimension as the face of the corresponding chip, whether it is the case of the second support 4 or of the third support 5.

FIGS. 14 to 21 show a sequence of potential steps according to another embodiment. This example is particularly advantageous for the individual transfer of chips with a small spacing of the latter on the face of the second support. This allows for example subsequently an additional transfer, which can be collective, on a third support, with a high final chip density and/or a precise alignment of each chip.

Figure 14:
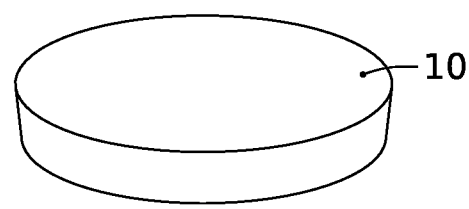
FIGS. 14 and 15 show a possible starting point for a method for producing chips.

In FIG. 14, a plate 10 of a material intended to be the base for manufacturing the chip is used. For example, it could be an InP plate, potentially 50 mm in diameter, with a thickness of around 350 μm (+/−25 μm). Advantageously, a non-stick film is deposited, for example by a centrifugal spreading (known as spin coating), with a machine which holds the plate by its edge so as not to touch the front face of the latter.

Figure 15:
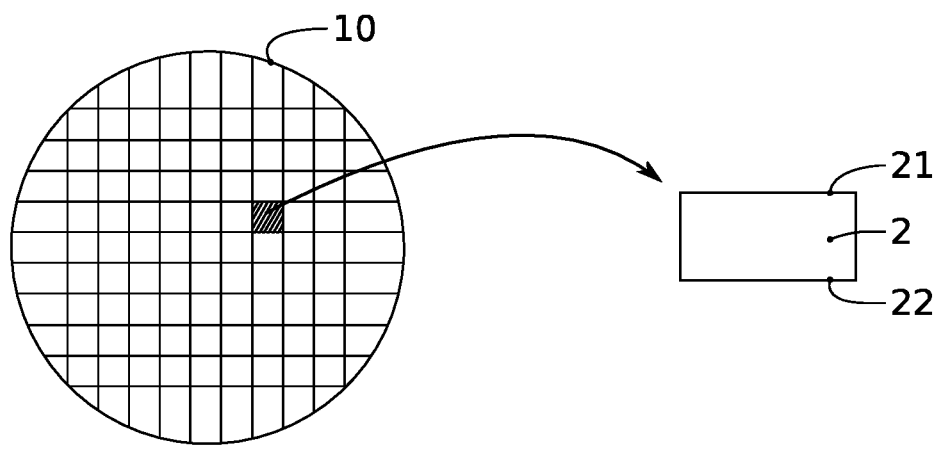

FIG. 15 shows a singularisation of chips 2 from the plate 10. This may be cutting. The size of the chips is not limiting, but they can be chips of the order of 10×10 mm². The front face here corresponds to the reference 22 and the rear face to the reference 21. It is the surface 22 which receives the non-stick film to make this face hydrophobic.

Each chip 2 can be grasped by a displacement device 100 comprising a pick and place head 110. As indicated above, the technique known as "pick and place" can be used here. The pick and place head 110 includes a chip holding system. To this end, it may comprise, on its part intended to be positioned facing the face of the chip 2, a cavity capable of receiving, at least in part, the chip. A pyramidal shape of this cavity allows not to touch the face of the chip which fits into the cavity, by limiting contact to the border of the face. The retention of the chip can be carried out by a clamp technique retaining the chip by the edge, or by a low pressure effect (suction effect achieved by a vacuum) or by a venturi effect. These cases are not limiting. In general, any system for holding the chip on the pick and place head can be used. Activating such a system will retain the chip, and conversely, deactivating it will allow to release it.

Figure 16:
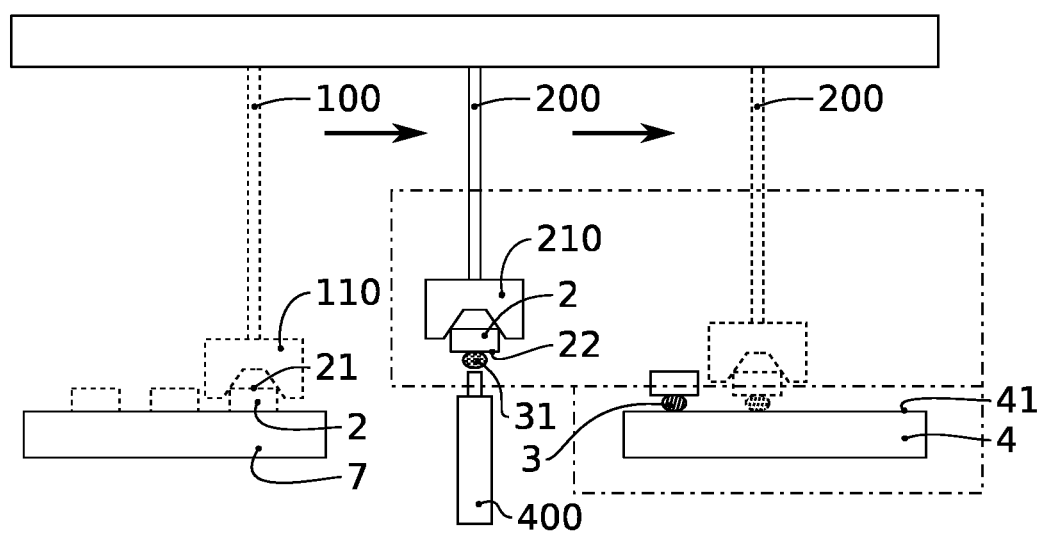
FIG. 16 illustrates a possibility of a succession of displacements of a chip in order to transfer same.

The head 110 allows, according to the case of FIG. 16, to place where the chips 2 are on an initial support 7, which is for example a handle. The latter was simply schematised in the form of a plate with a flat surface. However, it may be a more complex handle, for example of the type containing individual chip receiving cavities. This step can be useful for carrying out a surface preparation of the chips 2, and in particular of the rear face 21. For example, it can be a decontamination of hydrocarbons, which can be carried out with a dioxygen plasma. In addition, or alternatively, it can be a particulate decontamination, typically by megasonic treatment.

A placement device 200 is used to perform a new chip transfer 2. The device 200 may be of the type described above for the initial displacement device 100. It may, optionally, be the same device. In this embodiment, it is the device 200 which provides the first support 1 by means of its pick and place head. At this step, the chip 2 is therefore integral with the support 1 formed by the head of the device 200, the system for holding this head being activated to retain the chip 2.

During this new displacement, droplet deposition tool 400 is reached which allows to deposit a liquid coating in the form of a droplet 31 on the front face 22 of the chip 2. Use can be made of a droplet deposition tool existing on the market, such as those sold under the Trade Mark Microdrop®.

Optionally, the humidity of the atmosphere surrounding the tool 400 can be controlled to prevent the droplet 31 from evaporating too quickly.

Going further to the right of FIG. 16, the device 200 is again used to displace the chip 2, whose face 22 carries the droplet 31, towards the second support 4. Here again, the atmosphere can be controlled to avoid too rapid evaporation. An upper mixed dotted frame schematises this atmosphere.

The contacting of the droplet 31 with the face 41 of the second substrate 4 results in the interlayer 3. The second substrate 4 is placed at a temperature configured so that the contact with the droplet 31 produces a solidification. As in the previous examples, the cooling can be carried out in anticipation or a posteriori relative to the contacting on the face 41. However, in the case of a transfer of a plurality of chips 2, it is possible to choose to cool the second support 4 before placing the chips 2.

The positioning of the chip 2 on the face 41 can be carried out in a determined manner with respect to the alignment marks present on the substrate 4 and which can be detected by the device 200. A positioning precision can be achieved for example of the order of +−10 µm.

The support 4 can for example be a temporary substrate. Its face 41 is advantageously flat at the chip receiving surface, without the need to dispose individual cavities to hold them. Advantageously, the face 41 is hydrophobic like the face 22 of the chips 2.

As before, the cooling of the material of the interlayer 3 solidifies it. The chip 2 is stabilised and secured to the second support 4 during this phase.

The chip 2 can then be released from the first support. The detachment can be carried out by releasing the grip of such a member on the chip (for example: opening of a clamp, elimination of a vacuum or of a venturi effect).

Preferably, a plurality of chips is, at this moment, present on the support 4, repeating the displacement manoeuvres of the devices 100, 200. The chips may be very close together on the face 41 of the second support 4. For example, the distance between the chips may be less than or equal to 100 µm, which could not be achieved with conventional techniques for holding the chips on a support provided with individual chip receiving cavities.

The volume surrounding the second substrate 4, shown in FIG. 16 by a lower mixed dotted frame can be controlled for the humidity of its atmosphere to prevent condensation. For this purpose, the atmosphere can be sufficiently dry carbon dioxide; nitrogen (forming the atmosphere surrounding the upper part of the chip) present above this volume of carbon dioxide can then have a different and sufficient humidity to prevent the droplet 31 from evaporating too quickly.

Subsequently, it is possible to carry out a transfer of the chips 2 on a third support 5.

The succession of steps in FIGS. 17 to 20 gives an example.

Figure 17:
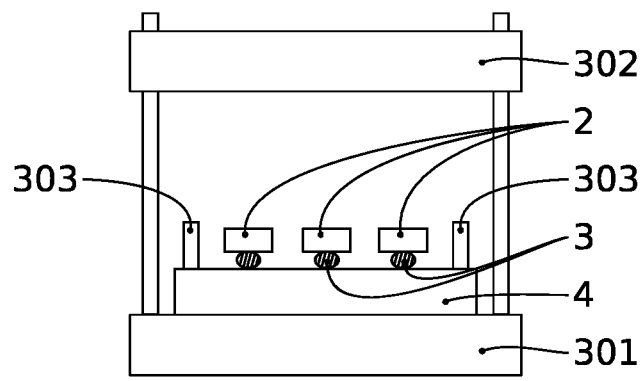
FIGS. 17 to 20 show successive chip transfer steps

In FIG. 17, the first support 4 still at a temperature to maintain the interlayer 3 in the solid state, is placed on a mandrel 301. In general, at this stage, it will be necessary to maintain the layer 3 in the solid state. In particular, the mandrel can be cooled. In order to prepare the docking of a third support 5, wedges 303 are, in the illustrated case, positioned on the face 41 of the support 4, so as to define a target spacing when docking the third support 5, presented later. In the example of chips resulting from a singularisation of a plate 350 µm thick, a wedge 375 µm high, depending on the thickness dimension of the chip, may be suitable, possibly with a margin of +/−5 µm.

Preferably, the atmosphere surrounding the mandrel 301 is also controlled to avoid condensation.

The machine carrying the mandrel 301 moreover includes a second mandrel 302 capable of a translational movement to move closer or move away from the first mandrel 301, so as to provide a vice function.

Figure 18:
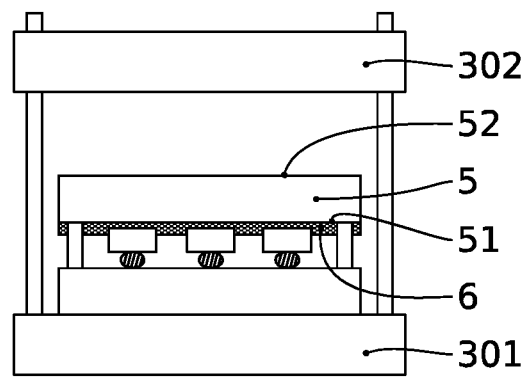

FIG. 18 shows the placement of the third support 5 above the stack formed by the second support 4, the droplets 3 and the chips 2. Previously, a liquid coating is formed on the face 51 of the third support 5 intended to receive the face 21 of the chips 2. Advantageously, the face 51 is hydrophilic like the faces 21 of the chips 2.

This coating, which can follow the examples given for the interlayer 3, and which can in particular be water or water-based, is advantageously deposited in the form of a film. It may be a film of deionised water spread over the face 51. The spreading parameters provided above are suitable.

Of course, it is also possible to use droplet formations for each chip. However, making a film allows to obtain, in a single step, a liquid interface for all the chips that need to be transferred.

When the third support 5 is placed, preferably with an alignment with an accuracy of at least +/−100 µm relative to the second support 4, it is held by the wedges 303. At the same time, the thickness of the film (or droplets) is configured so that the face 51 of the third support 5 is contacted with the liquid. A second interlayer 6 is thus formed between the face 21 of the chips 2 and the face 51 of the third support 5.

By raising the temperature of the second support 4, for example by cutting off the cooling of the mandrel 301, the interlayer 3 returns to the liquid state.

Preferably, this heating does not reach 100° C. and the surrounding atmosphere preserves a level of humidity which prevents the second interlayer 6 from evaporating too quickly.

Figure 19:
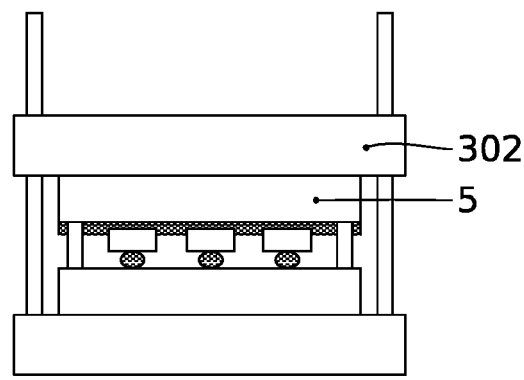
Figure 20:
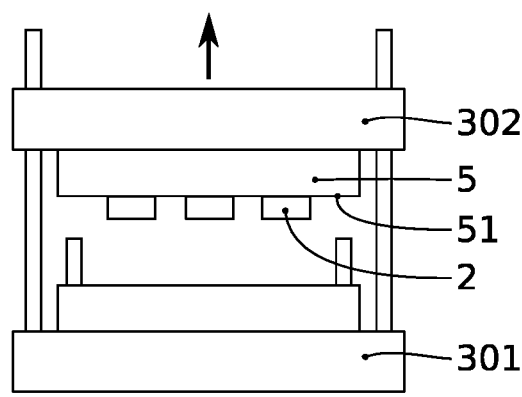
Figure 21:
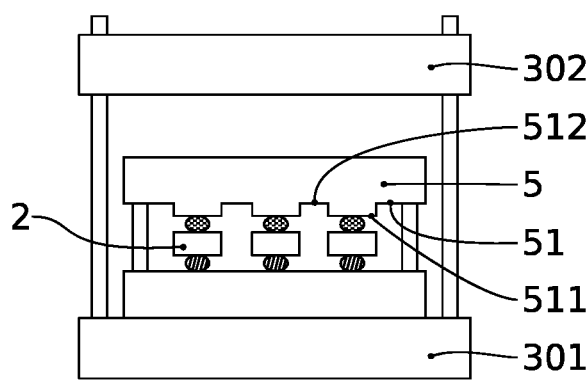
FIG. 21 provides a variant embodiment thereof.

A descent of the second mandrel 302 is shown in FIG. 19, so as to dock on the opposite face of the third support 5, for example by suction. The step in FIG. 19 can take place before the liquefaction of the interlayer 3.

However, this return to the liquid state takes place before detaching the chip 2 from the second substrate 4. In the example provided in FIG. 20, the detachment is produced by a rise of the second mandrel 302, taking with it the third support 5.

As described above, it is possible to act on the hydrophilic or hydrophobic nature of the surfaces to extract the chips 2 from the second support 4. In particular, the surfaces of the rear face 22 of the chip 2 and of the face 41 of the second support 4, which are related via the interlayer 3, will preferably be hydrophobic. At the same time, the surfaces of the front face 21 of the chip 2 and of the face 51 of the third support 5, which are connected through the second interlayer 6, will preferably be hydrophilic. The examples given previously to obtain the hydrophobic or hydrophilic character can be used in this embodiment as well.

The capillary force differential induced by the hydrophilic and hydrophobic surfaces allows to retain the chips 2 on the third support 5.

Preferably, the interlayer 6 is then removed. It can be a natural evaporation of the water, in a few hours. The chips 200 are glued by direct gluing to the substrate 5 which may be the final substrate.

As in the previous examples, the face 51 may include, around the assembly surfaces with the face 22 of the chips, a hydrophobic peripheral surface so as to locate the site of the gluing. On this subject, reference may be made to the phenomena of absorption of the alignment shifts described with reference to FIGS. 11 to 13. In this case, it is also possible, in addition or as an alternative, to use a face 51 having an assembly surface 511 projecting relative to a peripheral surface 512 of the face 51. This case corresponds to FIG. 21.

The various embodiments shown in the figures may be the subject of combinations of all or part of their features, without departing from the scope of the invention. This is particularly the case in the exploitation of hydrophilic and hydrophobic surfaces to manage the alignment and the precision of locating the gluing of the chips on a support. This is also the case for the management of the solidification and liquefaction phases of layers 3, 6 deposited in the liquid state.

The invention is not limited to the embodiments described above and extends to all embodiments covered by the claims.

The invention claimed is:

1. A method for transferring at least one chip, from a first support to a second support, comprising:
 forming, while the chip is integral with the first support, an interlayer in a liquid state between, and in contact with, a front face of the chip and an assembly surface of a face of the second support, and then a solidification of the interlayer in a solid state; and
 then, detaching the chip from the first support while maintaining the interlayer in the solid state,
 wherein the solidification comprises placing the assembly surface of the face of the second support at a temperature below a solidification temperature of the interlayer,
 wherein the forming the interlayer comprises forming a liquid coating configured to form the interlayer on the front face of the chip, then approaching the first support and the second support so as to contact the liquid coating and the assembly surface of the face of the second support,
 wherein the placing the assembly surface of the face of the second support at a temperature below a solidification temperature of the interlayer is carried out before contacting the liquid coating with the assembly surface of the face of the second support, and
 wherein the detaching comprises a relative displacement of the first support and of the second support configured to break a mechanical bond between the first support and the chip.

2. The method according to claim 1, further comprising, after the detaching, removing the interlayer and direct bonding the front face of the chip on the assembly surface of the face of the second support.

3. The method according to claim 2, wherein the removing the interlayer comprises evaporating the interlayer.

4. The method according to claim 1, wherein the assembly surface of the face of the second support is formed with same dimensions as those of the front face of the chip.

5. The method according to claim 1, wherein the assembly surface of the face of the second support is disposed projecting on the face of the second support.

6. The method according to claim 1, further comprising, after the detaching, securing a rear face, opposite the front face, of the chip on a face of a third support, then separating the front face of the chip and the assembly surface of the face of the second support, wherein the interlayer is returned to the liquid state before the separating the front face of the chip.

7. The method according to claim 1, further comprising, after the detaching, securing a rear face, opposite the front face, of the chip on a face of a third support, then separating the front face of the chip and the assembly surface of the face of the second support.

8. The method according to claim 7, wherein the front face of the chip and the assembly surface of the face of the second support are hydrophobic, and wherein the securing the rear face of the chip comprises:
 forming a second interlayer in the liquid state between, and in contact with, the rear face of the chip and an assembly surface of the face of the third support, the rear face of the chip and the assembly surface of the face of the third support being hydrophilic, and then,
 while the interlayer and the second interlayer are in the liquid state, separating the front face of the chip and the assembly surface of the face of the second support comprising a relative displacement of the second support and the third support.

9. The method according to claim 8, further comprising, after the separating, removing the second interlayer, and direct bonding the rear face of the chip on the assembly surface of the face of the third support.

10. The method according to claim 8, wherein the assembly surface of the face of the third support is formed with same dimensions as those of rear face of the chip.

11. The method according to claim 8, wherein the assembly surface of the face of the third support is disposed projecting on the face of the third support.

12. The method according to claim 1, wherein the front face of the chip and the assembly surface of the face of the second support are hydrophilic, and wherein the assembly surface of the face of the second support is surrounded by a hydrophobic surface.

13. The method according to claim 1, further comprising, before the forming the interlayer:
 removing, while the chip is contained throughout the thickness of a surface layer of the first support, a portion of the surface layer configured to cut out the chip while preserving at least one anchoring area between the chip and the surface layer, and then
 removing a portion of a layer underlying the surface layer, configured to release a rear face of the chip, opposite the front face, so as to suspend the chip by the at least one anchoring area forming the mechanical bond.

14. The method according to claim 1, wherein the forming the interlayer comprises a phase of condensing, on the front face of the chip, a compound of an atmosphere wherein the first support and the second support are placed.

15. A method for transferring at least one chip, from a first support to a second support, comprising:
 forming, while the chip is integral with the first support, an interlayer in a liquid state between, and in contact with, a front face of the chip and an assembly surface of a face of the second support, and then a solidification of the interlayer in a solid state; and
 then, detaching the chip from the first support while maintaining the interlayer in the solid state,
 wherein the solidification comprises placing the assembly surface of the face of the second support at a temperature below a solidification temperature of the interlayer,
 wherein the forming the interlayer comprises forming a liquid coating configured to form the interlayer on the front face of the chip, then approaching the first support and the second support so as to contact the liquid coating and the assembly surface of the face of the second support,
 wherein the placing the assembly surface of the face of the second support at a temperature below a solidification temperature of the interlayer is carried out before contacting the liquid coating with the assembly surface of the face of the second support, wherein the first support is a chip pick and place head, and wherein the detaching comprises deactivating a system for holding the chip on the pick and place head, and wherein the forming the interlayer, successively comprises:
- picking up the chip, by a rear face opposite the front face, by the pick and place head from an initial support of the chip, the picking up comprising activating the system for holding the chip and raising the chip relative to the initial support;
- first displacing the pick and place head to a droplet deposition tool;
- forming a droplet, configured to form the interlayer, on the front face of the chip by the droplet deposition tool, the droplet deposition tool being positioned beneath the front face when the droplet is formed; and
- second displacing the pick and place head to the second support, the second displacing including lowering the chip so that the droplet contacts the face of the support from above the face of the support.

16. The method according to claim 15, further comprising repeating the transfer using the pick and place head successively, for a plurality of chips, so as to place the plurality of chips on the face of the second support.

* * * * *